United States Patent
Jung et al.

(10) Patent No.: US 10,724,967 B2
(45) Date of Patent: Jul. 28, 2020

(54) INSPECTION APPARATUS FOR SEMICONDUCTOR PROCESS AND SEMICONDUCTOR PROCESS DEVICE

(71) Applicant: SAMSUNG ELECTRONICS CO., LTD., Suwon-si, Gyeonggi-do (KR)

(72) Inventors: Myung Ho Jung, Suwon-si (KR); Young Su Ryu, Suwon-si (KR); Sung Chai Kim, Yongin-si (KR); Jong Su Kim, Seongnam-si (KR); Won Guk Seo, Gunpo-si (KR); Chang Hoon Choi, Hwaseong-si (KR); Jeong Su Ha, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/242,088

(22) Filed: Jan. 8, 2019

(65) Prior Publication Data

US 2019/0323973 A1 Oct. 24, 2019

(30) Foreign Application Priority Data

Apr. 20, 2018 (KR) .................. 10-2018-0046243
Oct. 11, 2018 (KR) .................. 10-2018-0120929

(51) Int. Cl.
| | |
|---|---|
| *G01N 21/00* | (2006.01) |
| *G01N 21/956* | (2006.01) |
| *G06T 7/00* | (2017.01) |
| *G01N 21/95* | (2006.01) |
| *H01L 21/67* | (2006.01) |

(Continued)

(52) U.S. Cl.
CPC ... *G01N 21/95607* (2013.01); *G01N 21/9501* (2013.01); *G06T 7/001* (2013.01); *G06T 7/11* (2017.01); *H01L 21/67253* (2013.01); *H01L 21/67288* (2013.01); *H01L 21/67703* (2013.01); *G06T 2207/30148* (2013.01)

(58) Field of Classification Search
CPC ................. G01N 21/95607; G01N 21/9501; G06T 7/11; G06T 7/001; G06T 2207/30148; H01L 21/67253; H01L 21/67288; H01L 21/67703; H01L 21/67748; G05B 19/4189; G05B 2219/31447

See application file for complete search history.

(56) References Cited

U.S. PATENT DOCUMENTS 6,748,293 B1 6/2004 Larsen
6,882,416 B1 4/2005 Hunter et al.
(Continued)

FOREIGN PATENT DOCUMENTS

| JP | 5937809 B2 | 6/2016 |
|---|---|---|
| KR | 10-0449346 B1 | 9/2004 |
| KR | 10-1717380 B1 | 3/2017 |

*Primary Examiner* — Peter B Kim
(74) *Attorney, Agent, or Firm* — Lee IP Law, P.C.

(57) ABSTRACT

An inspection apparatus for a semiconductor process and a semiconductor process device, the inspection apparatus including a transferer configured to transfer a process object between a plurality of chambers; at least one line camera installed above the transferer, the at least one line camera being configured to generate an original image by capturing an image of the process object transferred by the transferer; and a controller configured to receive the original image and to perform an inspection of the process object by correcting distortion of the original image due to a change in transfer speed of the transferer.

20 Claims, 9 Drawing Sheets

(51) Int. Cl.
*H01L 21/677* (2006.01)
*G06T 7/11* (2017.01)

(56) References Cited

U.S. PATENT DOCUMENTS

| | | |
|---|---|---|
| 2007/0182814 A1 | 8/2007 | Hayakawa et al. |
| 2011/0199476 A1 | 8/2011 | Ravid et al. |
| 2015/0051860 A1 | 2/2015 | Zuo et al. |
| 2015/0254827 A1 | 9/2015 | Kobayashi |
| 2015/0369753 A1 | 12/2015 | Romanovsky et al. |

INSPECTION APPARATUS FOR SEMICONDUCTOR PROCESS AND SEMICONDUCTOR PROCESS DEVICE

CROSS-REFERENCE TO RELATED APPLICATION

Korean Patent Application No. 10-2018-0046243 filed on Apr. 20, 2018 and Korean Patent Application No. 10-2018-0120929 filed on Oct. 11, 2018, in the Korean Intellectual Property Office, and entitled: "Inspection Apparatus for Semiconductor Process and Semiconductor Process Device," is incorporated by reference herein in its entirety.

BACKGROUND

1. Field

Embodiments relate to an inspection apparatus for a semiconductor process and a semiconductor process device.

2. Description of the Related Art

Line cameras are apparatuses for imaging objects to be inspected, such as semiconductor wafers, mother substrates for a display (LCD/OLED), or the like, and may normally capture objects to be inspected, moving at a constant speed, in spaces provided separately from processing chambers. Such line cameras operate in synchronization with the stages on which the inspected objects are placed.

SUMMARY

The embodiments may be realized by providing an inspection apparatus for a semiconductor process, the inspection apparatus including a transferer configured to transfer a process object between a plurality of chambers; at least one line camera installed above the transferer, the at least one line camera being configured to generate an original image by capturing an image of the process object transferred by the transferer; and a controller configured to receive the original image and to perform an inspection of the process object by correcting distortion of the original image due to a change in transfer speed of the transferer.

The embodiments may be realized by providing an inspection apparatus for a semiconductor process, the inspection apparatus including a transferer configured to accelerate and decelerate to transfer a process object in a predetermined transfer direction; a line camera installed above the transferer, the line camera being configured to generate an original image by capturing an image of the process object while the process object is transferred; and a controller configured to select a first region, including the process object, from the original image, generate a result image by correcting coordinates of pixels included in the first region, and control a semiconductor process applied to the process object by comparing the result image with a predetermined reference image.

The embodiments may be realized by providing a semiconductor process device including a plurality of processing chambers configured to perform a semiconductor process for a semiconductor wafer or a mother substrate for a display; a transfer chamber configured to supply the semiconductor wafer or the mother substrate for a display to the plurality of processing chambers; a line camera installed above a transfer path on which the transfer chamber transfers the semiconductor wafer or the mother substrate for a display, the line camera being configured to obtain an original image by capturing an image of the semiconductor wafer or the mother substrate for a display on the transfer path; and a controller configured to correct distortion of the original image to generate a result image, compare the result image with a predetermined reference image, and adjust at least one of process parameters of a semiconductor process performed in at least one of the plurality of processing chambers, depending on a comparison result between the result image and the predetermined reference image.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
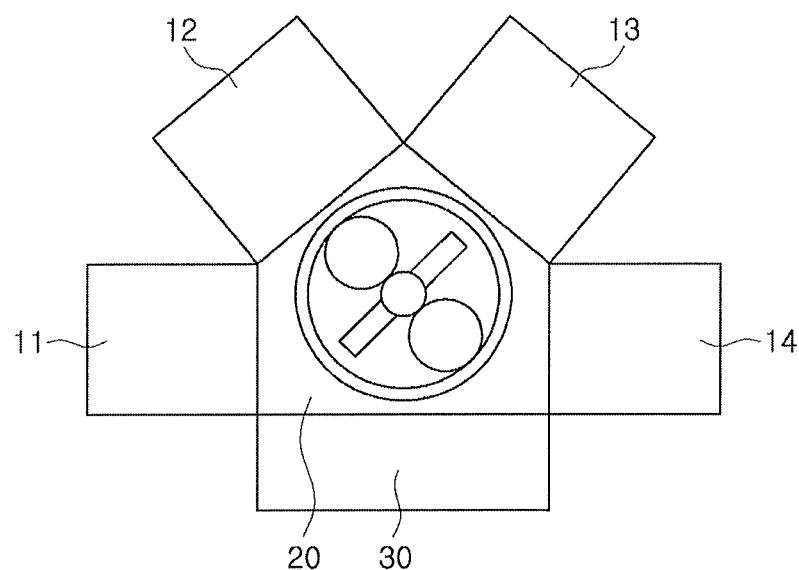
FIG. 1 illustrates a schematic view of a semiconductor process device in which an inspection apparatus and an inspection method according to an example embodiment may be employed.

FIG. 1 illustrates a schematic view of a semiconductor process device in which an inspection apparatus and an inspection method according to an example embodiment may be employed.

Referring to FIG. 1, a semiconductor process device 10 according to an example embodiment may include a plurality of processing chambers 11 to 14. The plurality of processing chambers 11 to 14 may receive a wafer through a transfer chamber 20 and a load-lock chamber 30 and may perform a semiconductor process. In an implementation, the plurality of processing chambers 11 to 14 may include, e.g., a plasma processing chamber in which plasma, including ions and radicals of a source gas, is generated, to perform an etching or deposition process, and/or a polishing processing chamber in which a chemical mechanical polishing process is performed, and the like.

In an implementation, each of the transfer chamber 20 and the load-lock chamber 30 may include a transfer device or transferer, and the transferer of the transfer chamber 20 and the load-lock chamber 30 may transfer a wafer to be processed, a mother substrate, or the like. The transferer may be a handler. For example, the transferer of the transfer chamber 20 may take a process object, such as a wafer, a mother substrate for a display, or the like, from the load-lock chamber 30, and may transfer the process object to the plurality of processing chambers 11 to 14, or may transfer the process object between the plurality of processing chambers 11 to 14.

In an implementation, the semiconductor process device 10 may apply various semiconductor processes such as a deposition process, a photolithography process, an etching process, a polishing process and the like to a process object such as a wafer or the like, and various structures may be formed on the process object, thereby implementing a desired semiconductor device. To determine whether the semiconductor process has progressed properly in each of the plurality of processing chambers 11 to 14, a line scan inspection may be performed on a wafer, a mother substrate for a display, or the like, having been completed in the process. The object of the line scan inspection may be defined as a concept including all objects to which the semiconductor process may be applied, in addition to the wafer or the mother substrate for a display.

For example, a line scan inspection may be performed by moving a process object such as a wafer or the like to which a semiconductor process has been applied or is to be applied, to a separate space having a stage, a line camera and the like, and then, by imaging (e.g., capturing an image of) the process object with the line camera while the process object moves at a constant speed on a stage. An image obtained by imaging the process object by the line camera may be compared with a predetermined reference image, to be used to control the semiconductor process. To help prevent distortion of the image of the process object captured by the line camera, the line camera may not capture an image of the process object while an object of the process object is being accelerated or decelerated. Only in a constant speed section in which the process object moves at a constant speed, the process object may be imaged. For example, a constant speed section sufficient to capture a process object may be secured, an inspection period of time may be prolonged, and a separate space for performing line scan inspection may be used.

In an implementation, at least one line camera may be installed in the semiconductor process device 10 performing a semiconductor process to efficiently perform a line scan inspection. The line camera may be installed above a transfer path on which a transferer of the transfer chamber 20 or the load-lock chamber 30 transfers a process object (such as a wafer or the like), and may capture an image of the process object moving along the transfer path.

For example, a line camera may obtain an original image by capturing an image of a process object while the process object moves along the transfer path. The time during which the process object stays in the transfer path may be relatively short, as compared with other methods in which a process object moves on a stage provided in a separate inspection space. Thus, a sufficient imaging time may not be secured when imaging a process object only in a constant speed section in which the process object moves at a constant speed. According to an embodiment, the line camera may also capture an image of a process object in a section in which a transfer speed (at which the transferer moves the process object along the transfer path) changes, e.g., in an acceleration and/or deceleration section of the transferer.

For example, when the line camera captures an image of the process object in the acceleration section and/or the deceleration section of the transferer, the process object could appear distorted in the original image generated by the line camera. According to an embodiment, distortion included in the original image generated by the line camera may be corrected to generate a result image in which the process object is accurately reflected. Thus, while the accuracy of the line scan inspection is maintained, the line scan inspection may also be performed while the semiconductor process device 10 performs a semiconductor process without any additional space or inspection time, thereby improving the efficiency of the line scan inspection.

Figure 2:
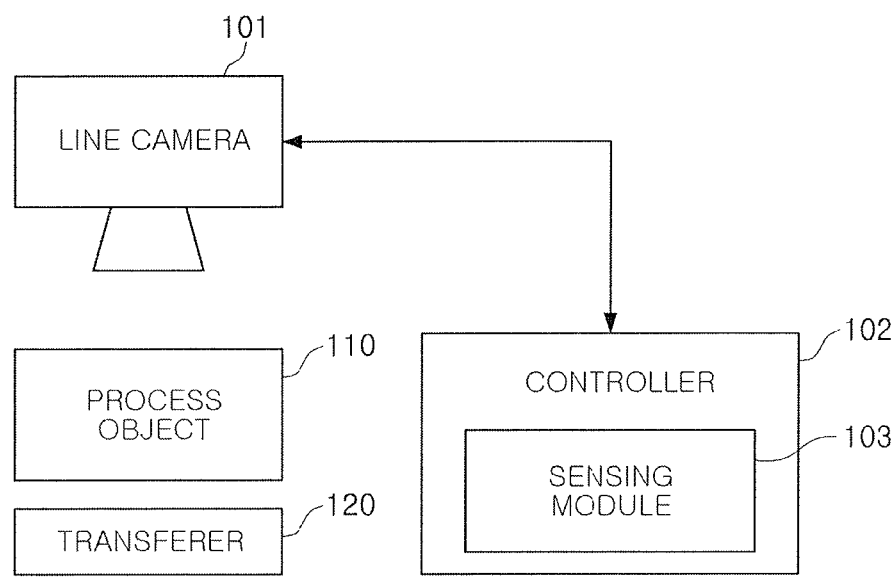
FIG. 2 illustrates a schematic block diagram of an inspection apparatus according to an example embodiment.

FIG. 2 illustrates a schematic block diagram of an inspection apparatus according to an example embodiment.

Referring to FIG. 2, an inspection apparatus 100 according to an example embodiment may include a line camera 101 and a controller 102. The line camera 101 may capture an image of a process object 110 from above the process object 110 transferred between chambers by a transferer 120. Examples of the process object 110 may include a semiconductor wafer on which a semiconductor process may be performed, a mother substrate for a display, and the like.

The transferer 120 may perform a transfer operation in which the process object 110 is transferred to a processing chamber in which the semiconductor process is performed or in which the process object 110 is removed from the chamber after the semiconductor process is completed. The transferer 120 may perform the transfer operation along a predetermined transfer path, and the line camera 101 may be installed above the transfer path to capture an image of the process object 110.

In an implementation, when the time for the transfer operation of moving the process object 110 by the transferer 120 is not relatively long, e.g., when the transfer path is not long, it could be difficult to secure a sufficient time for the line camera 101 to capture an image of the process object 110. According to an embodiment, an original image, which is obtained as the line camera captures an image of the process object 110 in an acceleration section in which a transfer speed at which the transferer 120 moves the process object 110 increases and in a deceleration section in which the transfer speed decreases, may be used for a line scan inspection. The process object 110 may appear distorted in the original image captured in the acceleration period and the deceleration period, an appropriate image correction process to correct the distortion may be performed.

In an implementation, the controller 102 may correct image distortion of the process object 110 appearing in the original image generated by the line camera 101, without receiving separate data from the transferer 120 and the semiconductor process device including the transferer 120. The controller 102 knows or is programmed with a shape of the process object 110 in advance, and may thus operate in a stand-to-alone or standalone mode in correcting the distortion of the process object 110 included in the image acquired by the line camera 101, without separately receiving information such as change in the transfer speed of the transferer 120 or the like. Thus, the inspection apparatus 100 according to an example embodiment illustrated in FIG. 2 may be simply combined with the semiconductor process device to be subjected to the line scan inspection, such that the line scan inspection may be performed.

In an implementation, regardless of whether the process object 110 is present on the transfer path, the line camera 101 may continuously capture an image of the transfer path, as well as image capturing in the constant speed section in which the transfer speed of the transferer 120 moving the process object 110 is constant. The controller 102 may include a sensing module 103, and the sensing module 103 may select frames including the process object 110 from the image captured by the line camera 101, to generate an original image. In an implementation, the sensing module 103 may be implemented as a software module. The controller 102 may analyze the image captured by the line camera 101 on a frame unit basis, to extract frames in which the process object 110 is present, by referring to sensing information generated by the sensing module 103, thereby generating the original image for a line scan inspection, which will be described in more detail with reference to FIGS. 3 and 4.

Figure 3:
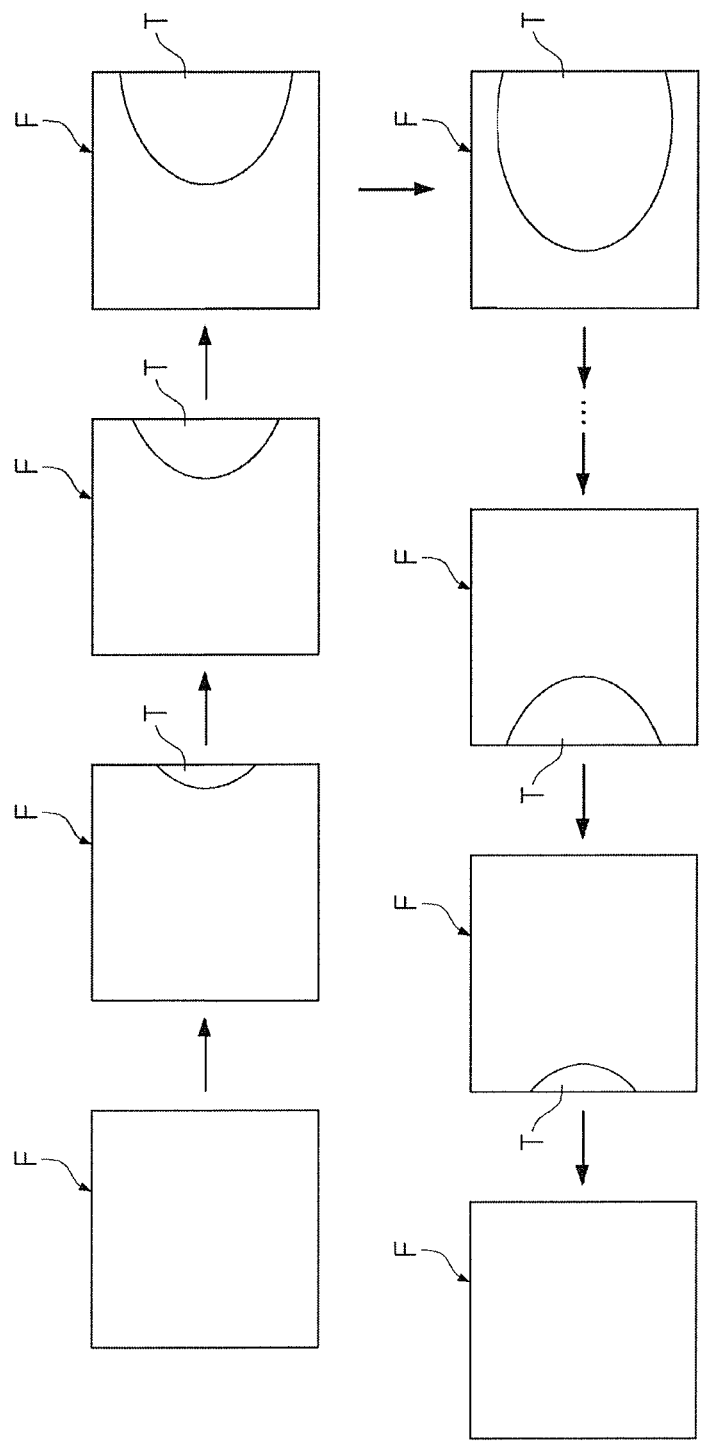
FIGS. 3 and 4 illustrate schematic drawings of images captured by a line camera of an inspection apparatus according to an example embodiment.
Figure 4:
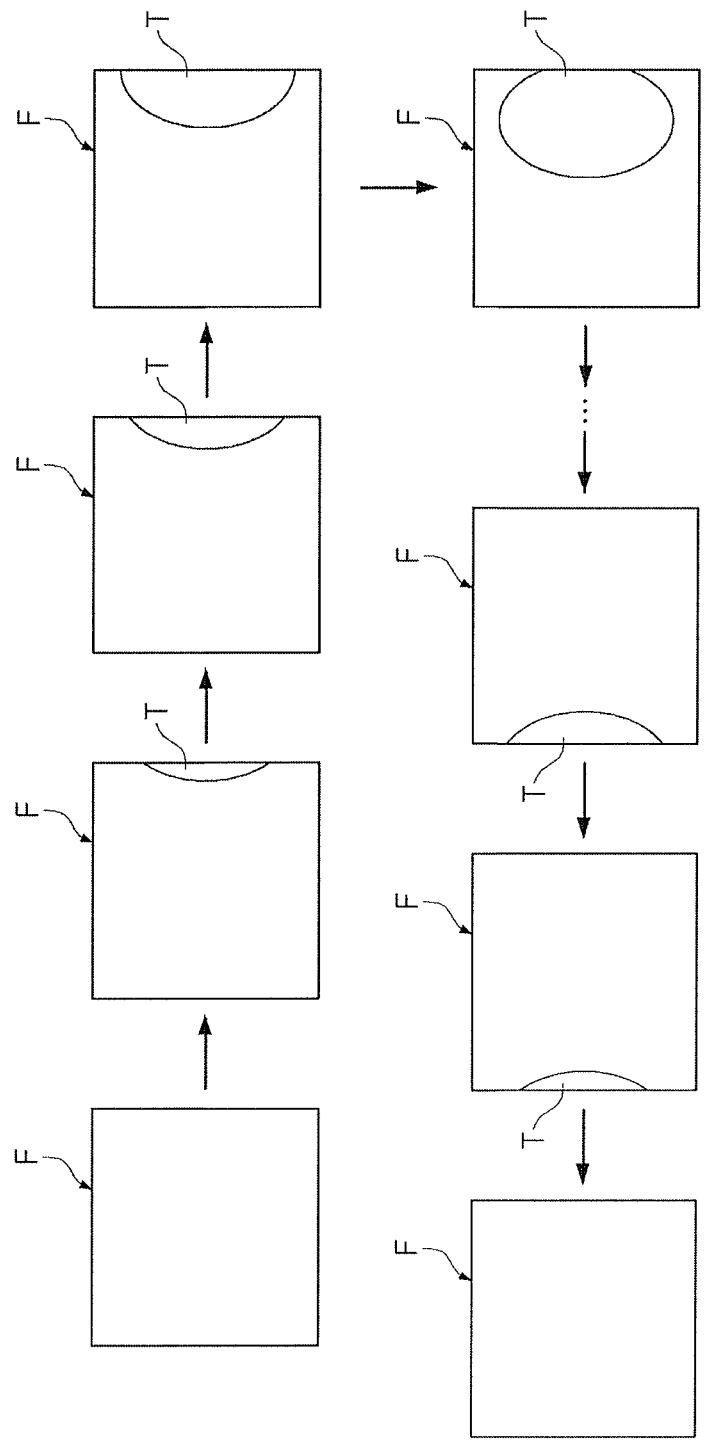

FIGS. 3 and 4 illustrate schematic drawings of images captured by a line camera of an inspection apparatus according to an example embodiment.

Referring first to FIG. 3, an image captured by a line camera may include a plurality of frames F. The line camera may continuously capture an image of the transfer path, irrespective of whether the transferer is transferring a process object T along a transfer path. For example, as illustrated in FIG. 3, the image generated by the line camera may also include frames F not including the process object T.

For example, when the transferer transfers the process object T as the line camera captures an image of the transfer path, the process object T may be included in at least a portion of the frames F included in the image captured by the line camera. As described above with reference to FIG. 2, the controller may include a sensing module, and the sensing module may select the frames F including the process object T to detect an original image to perform a line scan inspection.

In an implementation, as the line camera captures an image of the transfer path, the speed at which the transferer transfers the process object T may increase or decrease, and the process object T may appear distorted in the original image, differently from an actual shape of the process object T. The example embodiment illustrated in FIG. 3 may correspond to a case in which a transfer speed of the process object T increases in a transfer direction. For example, the process object T, such as a wafer or the like that actually has circular shape, may appear in the original image to have an elliptical shape (having a long axis in the transfer direction). To help improve the accuracy of the line scan inspection, in an example embodiment, image distortion may be corrected by applying an image correction process for each pixel to each process object T included in the original image.

The example embodiment illustrated in FIG. 4 may correspond to a case in which the transfer speed of the process object T decreases in a transfer direction. Thus, in a manner different from the example embodiment of FIG. 3, the process object T that actually has a circular shape may be displayed on the original image as having an elliptical shape having a short axis in the transfer direction.

Figure 5:
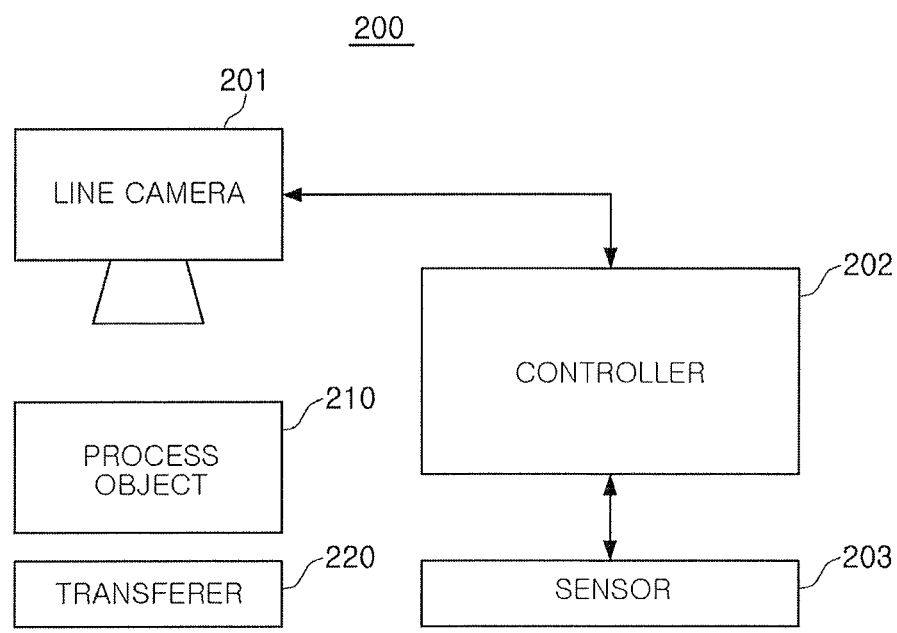
FIG. 5 illustrates a schematic block diagram of an inspection apparatus according to an example embodiment.

FIG. 5 illustrates a schematic block diagram of an inspection apparatus according to an example embodiment.

Referring to FIG. 5, an inspection apparatus 200 according to an example embodiment may include a line camera 201, a controller 202, and a sensor 203. In a manner similar to the example embodiment illustrated in FIG. 2, the line camera 201 may be installed above a process object 210 transferred by a transferer 220, and may capture an image of the process object 210. Examples of the process object 210 may include a wafer on which a semiconductor process may be performed, a mother substrate for a display, and the like.

As described above, in the example embodiment illustrated in FIG. 5, an image of the process object 210 may also be captured in an acceleration section in which a transfer speed at which the transferer 220 moves the process object 210 increases and in a deceleration section in which the transfer speed decreases, and the image may be used for a line scan inspection. The process object 210 may appear distorted in the image thereof captured in the acceleration section and the deceleration section, and an appropriate image correction procedure to correct distortion may be performed.

In the example embodiment illustrated in FIG. 5, the sensor 203 may detect whether the process object 210 is transferred, and may thus control imaging timing of the line camera 201. In an implementation, the sensor 203 may sense whether the transfer of the transferer 220 is started or is to enter a transfer path, and the controller 202 may determine an imaging time point of the line camera 201, in response to a sensing result of the sensor 203. For example, when the sensor 203 detects that the process object 210 deviates from the transfer path, the controller 202 may terminate the imaging operation of the line camera 201.

As described in the foregoing embodiment with reference to FIG. 2, in an example embodiment, in a state in which the controller 202 is not interlocked with the transferer 220 and a process device including the transferer 220, the controller 202 may correct distortion of the process object 210 (which may appear distorted in the image captured by the line camera 201). For example, in correcting the distortion of the process object 210 included in the image acquired by the line camera 201, the controller 202 may perform an image correction process without separately receiving information regarding a change in a transfer speed of the transferer 220 or the like. Thus, the inspection apparatus 200 according to the example embodiment illustrated in FIG. 5 may be operated independently by being coupled to the process device to be subjected to a line scan inspection, and may perform a line scan inspection by being connected to the process device without a complicated installation procedure.

Figure 6:
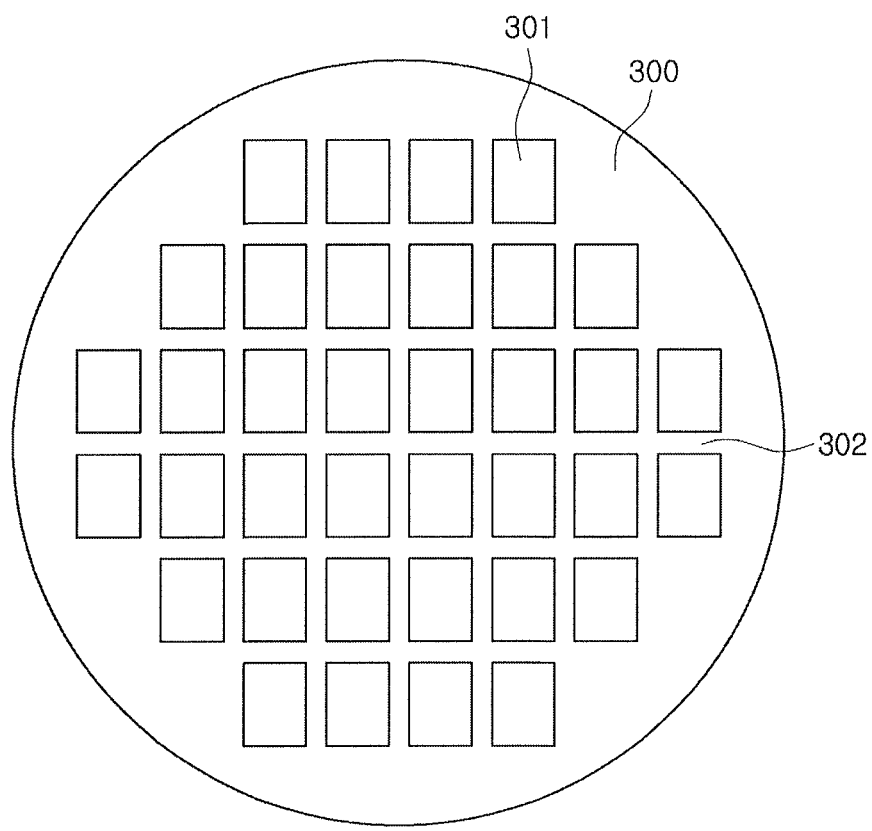
FIGS. 6 and 7 illustrate schematic views of process objects to which an inspection method according to an example embodiment may be applied.
Figure 7:
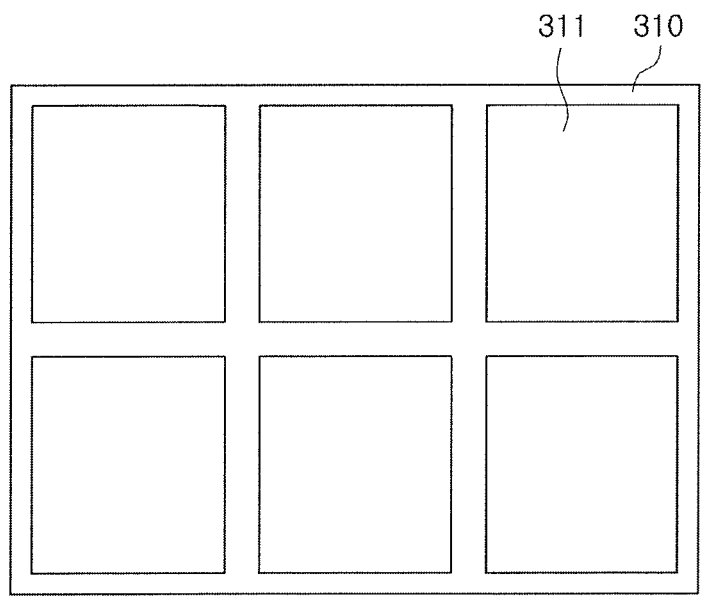

FIGS. 6 and 7 illustrate schematic views of process objects to which an inspection method according to an example embodiment may be applied.

Referring to FIG. 6, a process object according to an example embodiment may be a semiconductor wafer 300. The semiconductor wafer 300 may include a plurality of semiconductor dies 301 on which a plurality of semiconductor devices are formed, and a divided region 302 defined between the plurality of semiconductor dies 301. Each of the plurality of semiconductor dies 301 may include at least one integrated circuit chip. For example, each of the plurality of semiconductor dies 301 may be provided with various circuit elements such as a resistor, a capacitor, a transistor, a diode, and the like, formed thereon. The plurality of semiconductor dies 301 may be arranged in a plurality of rows and columns.

The divided region 302 may be a region in which the semiconductor dies 301 are separated from each other by a scribing process. Thus, in the divided region 302, the circuit elements may not be disposed in a manner different from the semiconductor dies. However, some test elements may be formed in the divided region 302 according to example embodiments. In consideration of efficiency and reliability of the scribing process and the like, the divided region may be defined by a plurality of linear portions defined between the plurality of semiconductor dies 301 arranged in a plurality of rows and columns.

Semiconductor processes (such as a photolithography process, a deposition process, an etching process, a polishing process, and the like) may be performed to form an integrated circuit chip on the plurality of semiconductor dies 301. If semiconductor processes are not properly controlled, various defects could occur in at least a portion of the plurality of semiconductor dies 301. In an example embodiment, while the transferer transports the semiconductor wafer 300 in a semiconductor process device performing semiconductor processes on the semiconductor wafer 300, the line camera may capture an image of the semiconductor wafer 300, and the captured image may be analyzed, thereby determining whether the semiconductor process is performed properly, whether adjustment of a process variable is required to control the semiconductor process, or the like.

In an implementation, brightness of an image captured by the line camera, and the like, may be analyzed to determine a thickness of a pattern, a layer or the like included in the inspection object, and thus, whether the semiconductor process is appropriately controlled may be determined. In addition, the image obtained by imaging the semiconductor wafer 300 may be compared with a predetermined reference image, to determine whether a defect has occurred, or the like. The reference image may be an image obtained by imaging a reference wafer having a good yield with a line camera.

The failure determination process using the image obtained by capturing the image of the semiconductor wafer 300 may also be performed by comparing the plurality of semiconductor dies 301 with each other or by comparing a plurality of unit regions defined in each of the plurality of semiconductor dies 301 with each other. For example, in a case in which at least a portion of the semiconductor processes applied to the semiconductor wafer 300 is not properly controlled, defects having a certain tendency could occur in the plurality of semiconductor dies 301 included in the semiconductor wafer 300. In this case, by comparing and analyzing the tendency of defect with existing examples, it may be determined which process of the semiconductor processes applied to the semiconductor wafer 300 has a defect, which process variable needs to be adjusted in a semiconductor process in which a defect has occurred, and the like.

As described above, the defect determination process, using the image obtained by capturing the semiconductor wafer 300, may include an operation of comparing the plurality of semiconductor dies 301 with each other or comparing the unit regions included in each of the plurality of semiconductor dies 301 with each other. Thus, if the semiconductor wafer 300 is distorted in the image provided by capturing the semiconductor wafer 300, the semiconductor die 301, which is not actually defective, may be erroneously determined as being defective. Thus, in an example embodiment, an image correction process to correct distortion of the image of the semiconductor wafer 300 may be performed before the defect determination process.

Referring to FIG. 7, an inspection object according to an example embodiment may be a mother substrate 310 for a display for production of a display device, such as an LCD, an OLED or the like. The mother substrate 310 for a display may include a plurality of panel units 311, and the plurality of panel units 311 may be provided as individual display panels. In an implementation, as illustrated in FIG. 7, a total of, e.g., six panel units 311 may be included in one mother substrate 310 for a display.

Semiconductor processes such as a photolithography process, a deposition process, an etching process, a polishing process, and the like may be performed on the mother substrate 310 for a display, to form various semiconductor devices including a plurality of pixel circuits. If the semiconductor processes are not properly controlled, defects could occur in at least a portion of the semiconductor devices formed on the panel units 311. Thus, in an example embodiment, in a process device in which the semiconductor processes are performed on the mother substrate 310 for a display, while the transferee transports the mother substrate 310 for a display, an image of the mother substrate 310 for a display may be captured by a line camera, and the captured image may be analyzed to determine whether the semiconductor processes are properly controlled.

The mother substrate 310 for a display may have a relatively large area as compared with that of the semiconductor wafer 300 according to the example embodiment illustrated in FIG. 6. Thus, in a line scan inspection for the mother substrate 310 for a display, a plurality of line cameras may be installed above a transfer path to capture an image of the mother substrate 310 for a display. The plurality of line cameras may be synchronized with each other to capture an image of the mother substrate 310 for a display and may acquire the image. The control device may combine the images respectively captured by the plurality of line cameras, to generate one image, thereby performing a line scan section.

Figure 8:
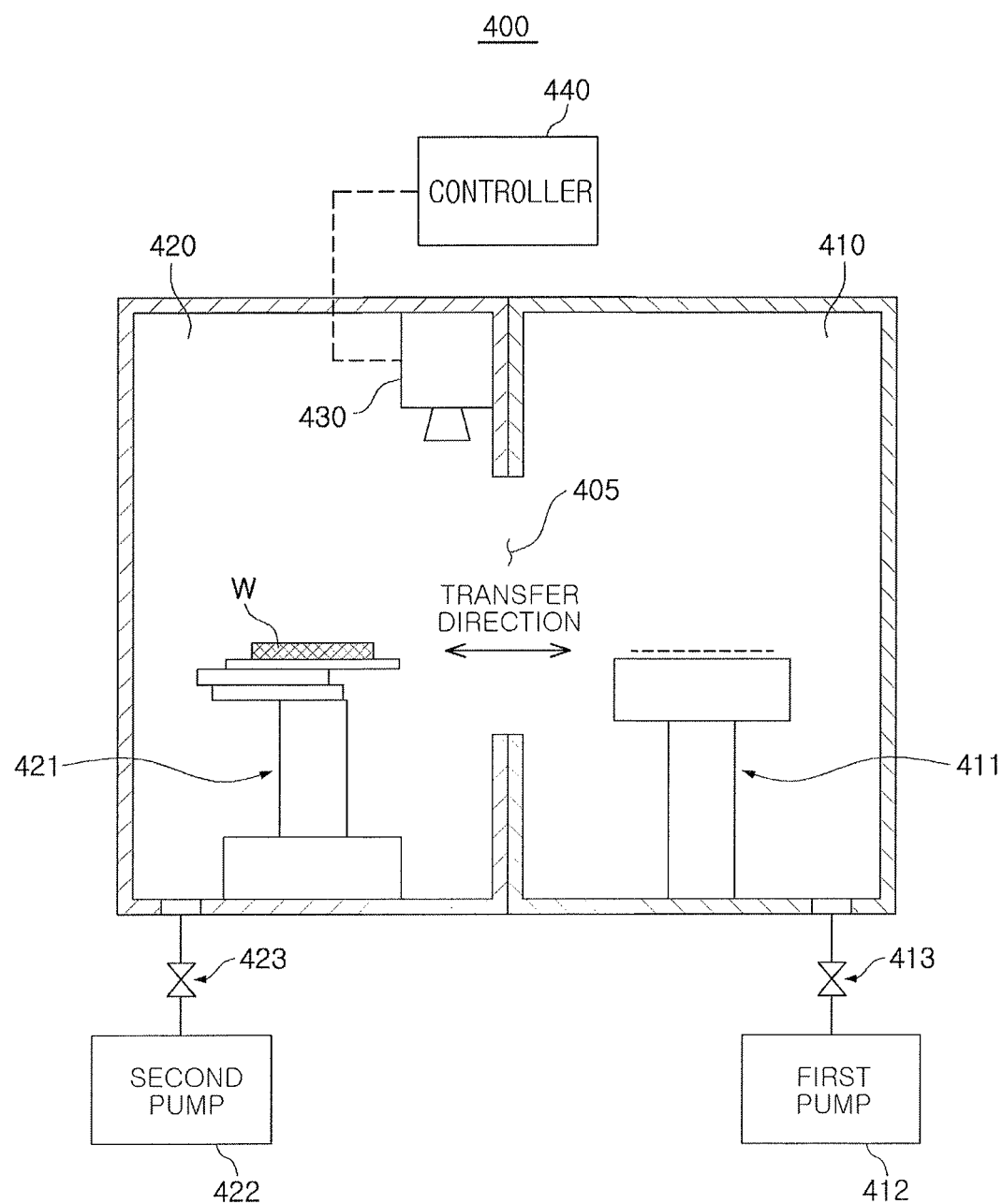
FIGS. 8 and 9 illustrate schematic views of a semiconductor process device according to an example embodiment.
Figure 9:
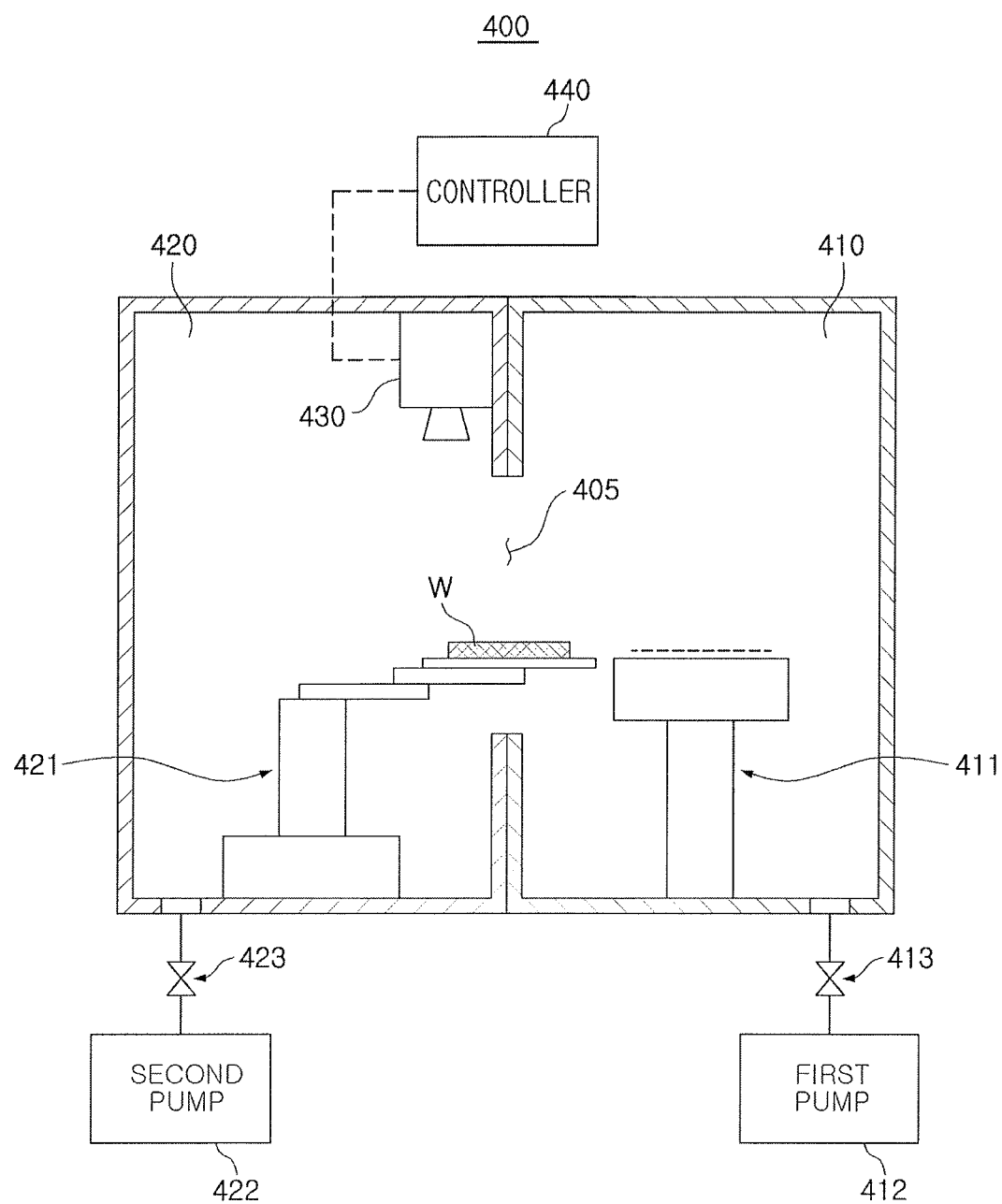

FIGS. 8 and 9 illustrate schematic diagrams of a semiconductor process device according to an example embodiment.

Referring to FIGS. 8 and 9, a semiconductor process device 400 according to an example embodiment may include a processing chamber 410 in which a semiconductor process is performed, a transfer chamber 420 transferring a semiconductor wafer W, a process object, to the processing chamber 410, and the like. A transfer path 405 may be provided between the processing chamber 410 and the transfer chamber 420, in such a manner that the transfer chamber 420 may insert the semiconductor wafer W into the processing chamber 410 or may remove the semiconductor wafer W from the processing chamber 410.

The processing chamber 410 may be provided with a mounting portion 411 on which the semiconductor wafer W is mounted. The mounting portion 411 may include an electrostatic chuck, and a plurality of protrusions may be formed on the electrostatic chuck to contact the semiconductor wafer W. The processing chamber 410 may be connected to a first pump 412 and a valve 413 to control pressure inside the chamber. In addition, the processing chamber 410 may be connected to a gas supply supplying gas for a process and a power supply applying a bias voltage depending on the type of a semiconductor process performed in the processing chamber 410.

The transfer chamber 420 may include a transferer 421 to transfer the semiconductor wafer W, a second pump 422 and a valve 423 to regulate pressure inside the transfer chamber 420, and the like. In an example, the transferer 421 may remove the semiconductor wafer W stored in a load-lock chamber or the like connected to the transfer chamber 420 therefrom, to insert the wafer W into the processing chamber 410, or may remove the semiconductor wafer W from the processing chamber after a semiconductor process is completed in the processing chamber 410, to put the semiconductor wafer W into another processing chamber or the load-lock chamber.

Referring to FIG. 9, the transferer 421 may transfer the semiconductor wafer W through the transfer path 405 between the processing chamber 410 and the transfer chamber 420. In an example embodiment, a line camera 430 may be installed above the transfer path 405, and the line camera 430 may capture an image of the semiconductor wafer W moving along the transfer path 405. An image obtained by capturing the semiconductor wafer W by the line camera 430 may be transmitted to a controller 440. The controller 440 may select frames in which the semiconductor wafer W is displayed, from the received image to generate an original image, and may correct distortion of the original image to generate a resultant image. The controller 440 may perform a line scan inspection on the semiconductor wafer W by comparing the result image with a predetermined reference image. In an implementation, the line camera 430 may be freely installed above the transfer path through which the semiconductor wafer W passes.

As the transferer 421 moves the semiconductor wafer W along the transfer path 405, an acceleration section, in which a transfer rate is increased, and a deceleration section, in which the transfer rate is decreased, are present. In a case in which the transfer path 405 is not sufficiently long, the line camera 430 may capture an image of the semiconductor wafer W, even in the acceleration section or the deceleration section in which the transfer speed changes. For example, the semiconductor wafer W may appear distorted in an original image. The controller 440 may correct for the distortion of the semiconductor wafer W in the original image, by correcting coordinates of respective pixels in the entirety of the original image or a first region in which the semiconductor wafer W is displayed in the original image.

Figure 10:
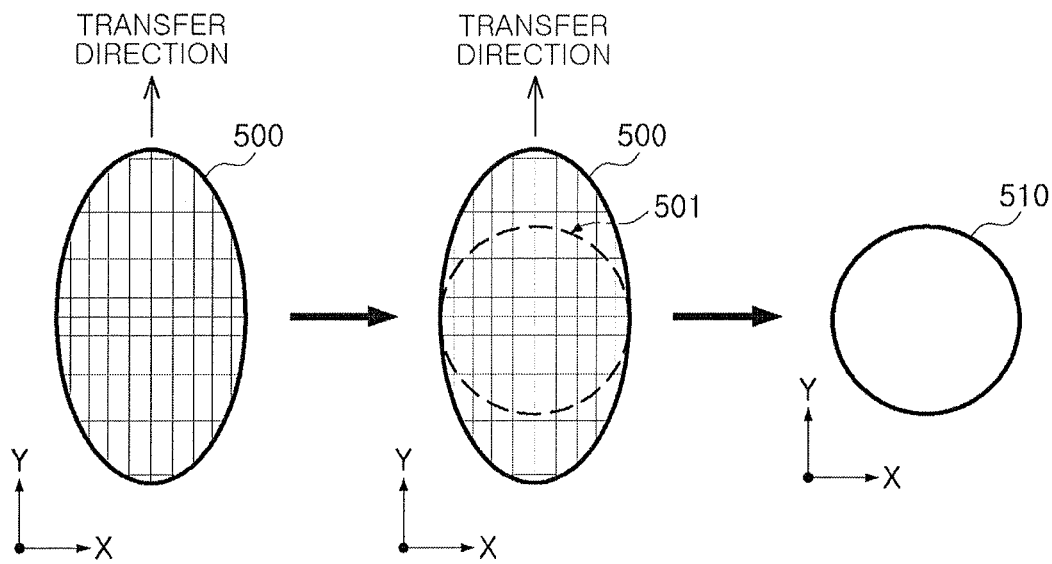
FIGS. 10 to 12 illustrate diagrams of stages in a method of correcting distortion of an image in an inspection method according to an example embodiment.
Figure 11:
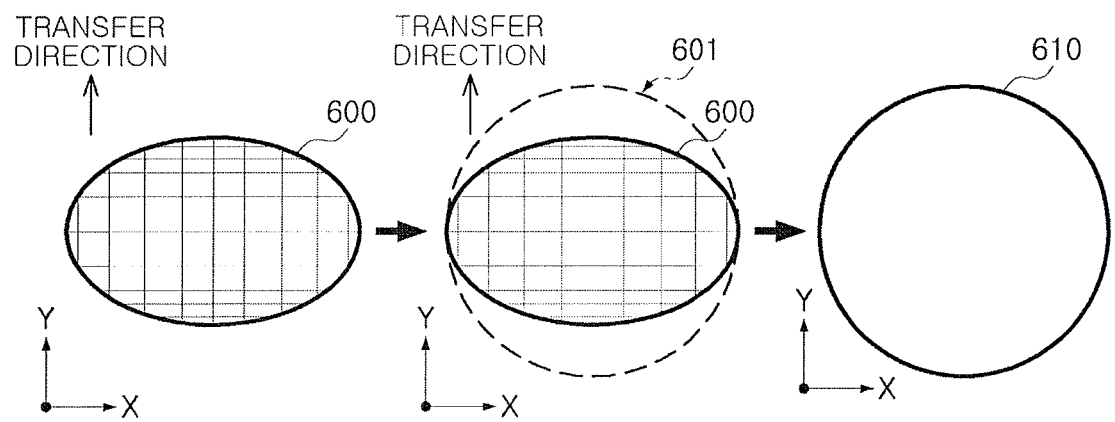
Figure 12:
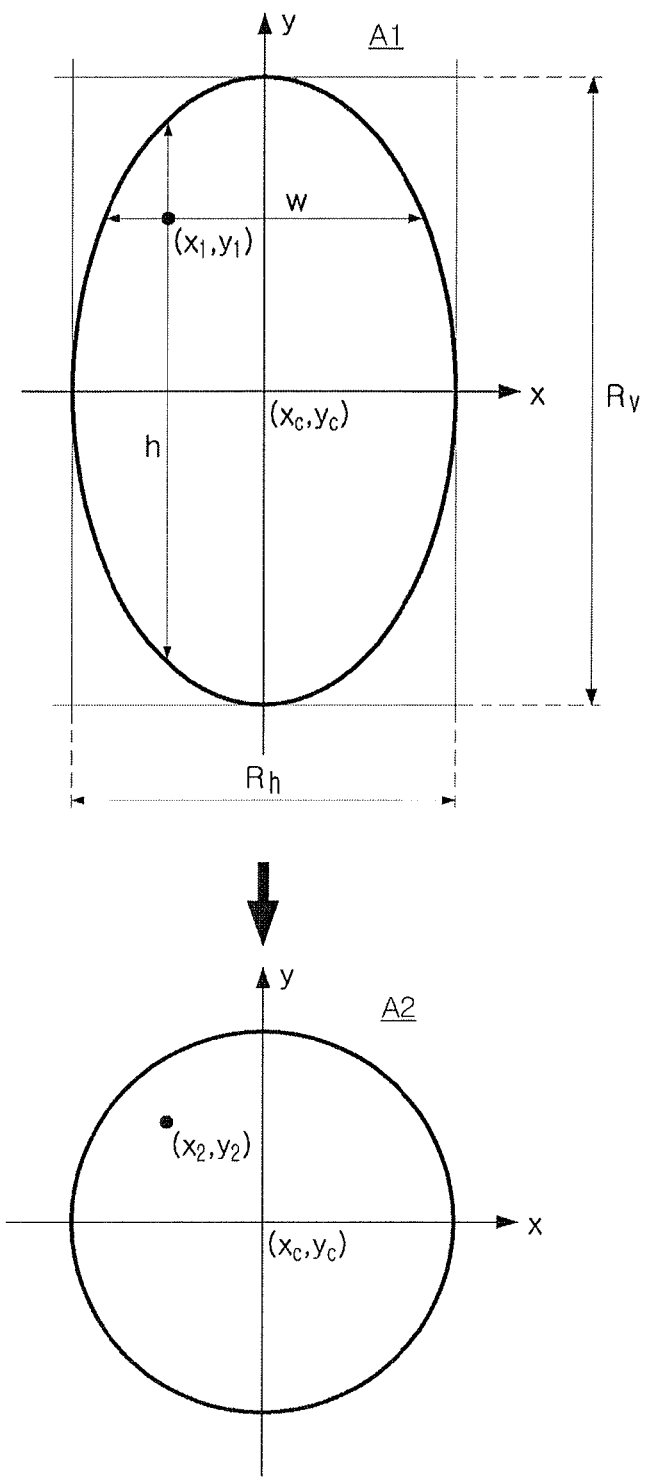

FIGS. 10 to 12 illustrate diagrams of stages in a method of correcting distortion of an image in an inspection method according to an example embodiment.

In an example embodiment, a line scan inspection may be performed using an image obtained by imaging an inspection object by a line camera while the transferer transports the inspection object. For example, a separate space and time may not be required for the line scan inspection, and the efficiency of the semiconductor process as well as the line scan inspection may increase. In an implementation, the line camera may capture an image of an object to be inspected during a time period during which the transferer transports the object to be inspected, and the line camera may also image the inspection object, even in an acceleration section and a deceleration section in which a transfer speed of the transferer transporting the inspection object is increased or decreased. In this case, the inspection object may appear distorted in an image thereof captured by the line camera, and an appropriate image correction method to correct such distortion may be employed in an example embodiment.

Hereinafter, an image correction method according to an example embodiment will be described with reference to FIGS. 10 to 12. In an example embodiment illustrated in FIGS. 10 to 12, the inspection object is a semiconductor wafer, for convenience of explanation. In an implementation, the process object may include suitable objects applicable to the semiconductor process, in addition to the semiconductor wafer.

Referring first to FIG. 10, an image acquired by the line camera may include a first region 500 in which a process object is displayed. In the example embodiment illustrated in FIG. 10, a transfer direction in which the transferer moves the process object may be a vertical direction (a Y axis direction). Thus, the process object may appear distorted in the vertical direction, a transport direction, in the first region 500. The example embodiment illustrated in FIG. 10 may correspond to a case in which the line camera captures an image of an object to be processed in an acceleration section in which a transfer speed is increased, and in this case, an area of the process object may be displayed distorted in the form of an extension in the transfer direction, in the first region 500.

In an example embodiment, the controller connected to the line camera may be provided with recognition with respect to the undistorted shape of the process object in advance. For example, the controller may define a second region 501 for correcting the process object displayed distorted in the first region 500. In the example embodiment illustrated in FIG. 10, the transfer direction is a vertical direction and the process object is a semiconductor wafer, and the second region 501 may be defined as a circle having a short axis of the first region as a diameter. The controller may generate a result image 510 by correcting coordinates of respective pixels included in the first region 500 of the process object according to a predetermined algorithm. In the result image 510, the process object may coincide with the actual shape. Referring to FIG. 10, the process object may have a circular shape corresponding to the semiconductor wafer in the result image 510.

Referring next to FIG. 11, an original image acquired by the line camera may include a first region 600 corresponding to a process object. In the example embodiment illustrated in FIG. 11, a transfer direction in which the transferer moves the process object may be a vertical direction (a Y axis direction). Thus, the first region 600 in which the process object appears distorted in the vertical direction, a transfer direction, may be included in the original image acquired by the line camera. In the example embodiment illustrated in FIG. 11, the line camera may capture the image of the process object in a deceleration section in which a transfer speed of the transferer moving the process object is reduced, and the process object may appear distorted in a compressed form in the transfer direction in the first region 600.

As described above, the controller connected to the line camera may know the shape of the process object in advance. Thus, the controller may define a second region 601 for correcting distortion of the process object displayed in the first region 600. In the example embodiment illustrated in FIG. 11, the transfer direction is the vertical direction and the process object is the semiconductor wafer, and the second region 601 may be defined as a circle having a long axis of the first region as a diameter. For example, the second region 601 may have an area larger than that of the first region 600. The controller may generate a result image 610 in which the process object is displayed in the second region 601, by correcting coordinates of respective pixels included in the first region 600 of the inspection object, according to a predetermined algorithm. In the result image 610, the process object may have a shape corresponding to an actual shape of the semiconductor wafer.

FIG. 12 illustrates a diagram of an image correction method according to an example embodiment in more detail. The image correction method described with reference to FIG. 12 may be an embodiment that may be selected by the inspection apparatus for the semiconductor process according to an example embodiment, and an image may also be corrected by selecting a method other than the image correction method described with reference to FIG. 12 or selecting another method in addition to the image correction method described above with reference to FIG. 12.

Referring to FIG. 12, an original image acquired by the line camera may include a first region A1. The first region A1 may be a region in which the process object is displayed, and in the example embodiment illustrated in FIG. 12, it may be understood that the line camera captures the image of the transfer path while the transferer transports the process object in a Y axis direction. A speed at which the transferer transfers the process object while the line camera images the transfer path, may increase, and thus, the process object may be distorted in the form increased in the Y axis direction. Thus, the process object may be displayed in the first region A1 having an elliptical shape.

In the image correction method that may be employed in an example embodiment, coordinates of respective pixels included in the first region A1 of the image captured by the line camera may be corrected, to generate a second region A2 corresponding to an actual shape of the process object. When the coordinates of the pixels included in the first region A1 are defined as first coordinates $(x_1, y_1)$, as the first coordinates $(x_1, y_1)$ are corrected to second coordinates $(x_2, y_2)$, the first region A1 may be converted into the second region A2.

In an implementation, in an image correction method according to an example embodiment, the first coordinates $(x_1, y_1)$ may be corrected using a first axis w and a second axis h defined by the first coordinates $(x_1, y_1)$, and a short axis $R_h$ and a long axis $R_v$ of the first region A1. The first coordinates $(x_1, y_1)$ may be corrected to second coordinates $(x_2, y_2)$ by a correction function using the first axis w and the second axis h, center coordinates $(x_c, y_c)$ of the first region A1, and the short axis $R_h$ and the long axis $R_v$ of the first region A1. In an implementation, the correction function may include a method as in the following Equation.

$$y_d = y_c \pm \frac{\sqrt{R_h^2 - w^2}}{2}$$

$$x_d = x_c \pm \frac{\sqrt{R_v^2 - h^2}}{2}$$

Distortion of the first region A1 may be corrected and the second region A2 may be generated, by correcting the first coordinates $(x_1, y_1)$ of all the pixels included in the first region A1 by the correction function. The second region A2 may have a shape corresponding to the actual shape of the semiconductor wafer, e.g., a process object. The controller may perform a line scan inspection, using a method such as comparing the second region A2 with a predetermined reference image or comparing a plurality of semiconductor dies that may be defined in the second region A2 with one another, or comparing unit regions within each of a plurality of semiconductor dies defined in the second region A2, with each other, or the like.

By way of summation and review, to capture an accurate image without distortion, constant velocity sections of inspected objects may be relatively long. For example, a relatively long period of inspection time as well as a separate inspection space may be required.

As set forth above, according to an example embodiment, a line camera may obtain an original image by capturing an image of a transfer robot while the transfer robot transfers a semiconductor wafer, a mother substrate for a display, or the like, to be processed, between a plurality of chambers, and a controller may compensate for distortion of the original image to compare the compensated image with a predetermined reference image. The controller may control a semiconductor process, based on the comparison result with the reference image. Thus, the inspection of the process object may be performed without a separate space and time, thereby increasing efficiency of an inspection process and a semiconductor process.

One or more embodiments may provide an inspection apparatus for a semiconductor process and a semiconductor process device, capable of performing an inspection by imaging an object of a process while a process object to which a semiconductor process is applied is transferred by a transferer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An inspection apparatus for a semiconductor process, the inspection apparatus comprising:
    a transferer configured to transfer a process object between a plurality of chambers along a transfer path;
    at least one line camera installed above the transferer, the at least one line camera being configured to generate an original image by capturing an image of the process object transferred by the transferer;
    a controller configured to receive the original image and to perform an inspection of the process object by correcting distortion of the original image due to a change in transfer speed of the transferer; and
    a sensor configured to detect whether the transferer transfers the process object below the at least one line camera and to determine an imaging time point of the at least one line camera and whether the process object deviates from the transfer path.

2. The inspection apparatus as claimed in claim 1, wherein the process object includes a semiconductor wafer or a mother substrate for a display.

3. The inspection apparatus as claimed in claim 1, wherein the plurality of chambers includes a plurality of processing chambers performing at least one semiconductor process, a load-lock chamber receiving the process object, and a transfer chamber transferring the process subject, between the load-lock chamber and the plurality of processing chambers.

4. The inspection apparatus as claimed in claim 3, wherein:
    the at least one line camera includes a plurality of line cameras, and
    the plurality of line cameras are installed between the plurality of processing chambers and the transfer chamber.

5. The inspection apparatus as claimed in claim 1, wherein the transferer accelerates or decelerates between the plurality of chambers to transfer the process object.

6. The inspection apparatus as claimed in claim 5, wherein the controller generates a result image by correcting distortion in the original image in a direction in which the transferer accelerates or decelerates.

7. The inspection apparatus as claimed in claim 6, wherein the controller determines a second region in which the process object is displayed, in the result image, by correcting coordinates of respective pixels included in a first region in which the process object is displayed in the original image.

8. The inspection apparatus as claimed in claim 7, wherein the first region has an elliptical shape.

9. The inspection apparatus as claimed in claim 8, wherein the controller corrects the coordinates of the respective pixels included in the first region, using a first value and a second value defined in the coordinates of the respective pixels included in the first region and a long axis and a short axis of the first region.

10. The inspection apparatus as claimed in claim wherein the long axis of the first region corresponds to a direction in which the transferer transfers the process object.

11. The inspection apparatus as claimed in claim 9, wherein the first value is a length of a chord passing through the respective pixels included in the first region, along the short axis, and the second value is a length of a chord passing through the respective pixels included in the first region, along the long axis.

12. The inspection apparatus as claimed in claim 7, wherein the second region has a shape corresponding to a shape of the process object.

13. The inspection apparatus as claimed in claim 1, wherein the controller performs an inspection with respect to the process object by comparing a result image obtained by correcting the distortion of the original image with a predetermined reference image.

14. The inspection apparatus as claimed in claim 1, wherein the controller selects frames in which the process object is displayed, to generate the original image, while the at least one line camera captures the image of the process object.

15. An inspection apparatus for a semiconductor process, the inspection apparatus comprising:
   a transferer configured to accelerate and decelerate to transfer a process object in a predetermined transfer direction along a transfer path;
   a line camera installed above the transferer, the line camera being configured to generate an original image by capturing an image of the process object while the process object is transferred;
   a controller configured to:
   select a first region, including the process object, from the original image,
   generate a result image by correcting coordinates of pixels included in the first region, and
   control a semiconductor process applied to the process object by comparing the result image with a predetermined reference image; and
   a sensor configured to detect whether the transferer transfers the process object below the line camera and to determine an imaging time point of the line camera and whether the process object deviates from the transfer path.

16. The inspection apparatus as claimed in claim 15, wherein the controller is configured to determine a second region including the process object in the result image by correcting the coordinates of the pixels included in the first region.

17. The inspection apparatus as claimed in claim 16, wherein a size of the second region is smaller than a size of the first region when the line camera captures an image of the process object while the transferer accelerates to transfer the process object.

18. The inspection apparatus as claimed in claim 16, wherein a size of the second region is larger than a size of the first region when the line camera captures an image of the process object while the transferer decelerates to convey the process object.

19. The inspection apparatus as claimed in claim 15, wherein the controller changes a value of at least one of process parameters to control the semiconductor process.

20. A semiconductor process device, comprising:
   a plurality of processing chambers configured to perform a semiconductor process for a semiconductor wafer or a mother substrate for a display;
   a transfer chamber configured to supply the semiconductor wafer or the mother substrate for a display to the plurality of processing chambers;
   a line camera installed above a transfer path on which the transfer chamber transfers the semiconductor wafer or the mother substrate for a display, the line camera being configured to obtain an original image by capturing an image of the semiconductor wafer or the mother substrate for a display on the transfer path;
   a controller configured to:
   correct distortion of the original image to generate a result image,
   compare the result image with a predetermined reference image, and
   adjust at least one of process parameters of a semiconductor process performed in at least one of the plurality of processing chambers, depending on a comparison result between the result image and the predetermined reference image; and
   a sensor configured to detect whether the transferer transfers the semiconductor wafer or the mother substrate for a display below the line camera and to determine an imaging time point of the line camera and whether the semiconductor wafer or the mother substrate for a display deviates from the transfer path.

* * * * *